United States Patent [19]

Danish et al.

[11] Patent Number: 4,567,469
[45] Date of Patent: Jan. 28, 1986

[54] MATRIX KEYBOARD

[75] Inventors: Sherif Danish; Hugh H. Aiken, both of Tulsa, Okla.

[73] Assignee: Polytel Corp., Sunnyvale, Calif.

[21] Appl. No.: 458,132

[22] Filed: Jan. 14, 1983

[51] Int. Cl.$^4$ .............................................. G06F 3/02
[52] U.S. Cl. ................................ 340/365 S; 200/5 A;
340/365 R; 340/365 C
[58] Field of Search ........... 340/365 R, 365 A, 365 L,
340/365 C, 365 S; 200/5 A; 178/17 C

[56] References Cited

U.S. PATENT DOCUMENTS

| 4,305,065 | 12/1981 | Mogi | 340/365 S |
| 4,429,301 | 1/1984 | Crumley | 340/365 S |
| 4,471,177 | 9/1984 | Doughty | 200/5 A |
| 4,495,485 | 1/1985 | Smith | 340/365 S |

OTHER PUBLICATIONS

IBM Technical Disclosure Bulletin, Holt, vol. 14, No. 8, Jan. 1972, p. 2277.

Primary Examiner—James J. Groody
Attorney, Agent, or Firm—Head, Johnson & Stevenson

[57] ABSTRACT

In an improved multikey keyboard for inputting data into a computer, wherein pressing a key places in circuit the point of intersection of at least one row conductor and column conductor respectively connected to portions of separate sets of row and column cascaded electrical elements whose cumulative values correspond to the specific row and column of the pressed key, the specific improvement comprising: providing the keyboard with an input signal source circuit and an output sensor circuit operatively connected to each key such that the computer upon receipt of a signal on the sensor circuit representing the pressing of a key, can make the necessary measurements to establish the identity of the pressed key.

11 Claims, 5 Drawing Figures

MATRIX KEYBOARD

BACKGROUND OF THE INVENTION

1. Field of the Invention

This invention relates to an improved multikey matrix keyboard involving a separate sense line and sensor circuit for monitoring when a key has been pressed. More specifically, the invention relates to an array or matrix keyboard involving a large number of individual keys wherein the specific row and column of the key being pressed is identified by the computer measuring cumulative values of cascaded electrical elements wherein the computer measurements are initiated in response to receiving a trigger signal on a sensor circuit operatively connected to each key.

2. Description of the Prior Art

Multikey keyboards for inputting data into a computer generally involve a plurality of normally open switches wherein the pressing of each key of the keyboard closes a corresponding switch. The set of normally open switches can be viewed as defining a switch matrix or switch array which in the conventional prior art keyboards have a plurality of input lines and a plurality of output lines. Pressing a key on the keyboard thus closing the corresponding switch creates electrical continuity and completes the circuit between the specific input and output lines corresponding to the respective position or identity of the key being pressed. This plurality of keyboard leads, in the conventional keyboard, is connected to at least one encoder which translates or converts the signals from the multiple key input circuits into a single alphanumeric coded output signal; e.g. in ASCII or binary coded decimal (BCD) format or the equivalent. The output signal from the keyboard encoder can then either be directed to the computer as the keyboard input or can be further processed by additional dedicated keyboard circuitry, depending on the particular manufacturing and overall computer system requirements, before entering the computer. Thus, it is not uncommon to find that the keyboard in addition to having an encoder will have its own dedicated memory and logic circuit essentially duplicating, in principle, that which the central processing unit (CPU) is theoretically capable of doing and consequently, increasing the cost of the keyboard. In practice, the presence of multiple input and output lines from the keyboard to the encoder tends to limit the number of keys present on the keyboard.

In a recent copending U.S. patent application based on and claiming priority to a French application, the present inventor discloses a resistive multikey computer keyboard involving an inexpensive yet reliable printed circuit array of flexible keys. According to this matrix keyboard, a portion of a series of sequential resistors are brought into the keyboard output circuit such that the cumulative values of the output resistance circuits uniquely determines the X and Y ranks of the pressed key. In a pair of concurrently filed and commonly assigned U.S. patent applications, multikey keyboards based on time delay elements and capacity circuit values are disclosed. In principle, the number of keys present on a matrix keyboard based on any arbitrary electrical measurement of a cascaded serial sequence of electrical elements selectively introduced into the keyboard output circuits is limited by the ability of the computer to resolve and distinguish successive cumulative electrical measurement values. The present invention is considered an improvement on the basic concept of the cascaded sequential electrical element keyboard in that it provides a method of monitoring all of the keys and initiating and terminating the respective measurements necessary to establish which key was pressed upon receipt of a signal created by pressing and subsequently releasing of the key.

SUMMARY OF THE INVENTION

In view of the limitations associated with the prior art multikey matrix keyboards, we have discovered a method of enhancing the computer's ability to measure a greater variety of types of cascaded electrical elements and to more efficiently monitor when to measure and when to stop measuring these values, such as to determine which key on the matrix keyboard was pressed or, in fact, whether a key was pressed.

Thus, the present invention provides in a multikey keyboard for inputting data to a computer wherein the X and Y ranks of the pressed key are determined by the closing of a corresponding key switch that brings into the X and Y keyboard output circuits selected portions of at least a pair of separate series of electrical elements whose respective cumulative values are subsequently measured by the computer to uniquely establish the coordinates of the pressed key, the specific improvement comprising: providing the keyboard with a sensor circuit means comprising a keyboard output sensor terminal electrically connected to a conductor circuit wherein the conductor circuit is operatively connected to each of the key switches; and further providing the keyboard with a singal source circuit means comprising a keyboard input signal terminal electrically connected to a conductor circuit wherein the conductor circuit is operatively connected to each of the key switches, such that when a key is pressed, the signal source circuit means is brought into circuit with the sensor circuit means thus triggering the computer to measure the cumulative values that establish the coordinates of the pressed key.

The present invention further provides that in a matrix keyboard of the membrane type comprising opposed printed sheets each containing half or a portion of the keyboard circuit and separated by a perforated insulating layer wherein the opposed printed circuits at the perforated openings serve as keys by allowing the printed sheets to flex and make electrical contact: the specific improvements of controlling the relative thickness of the printed sensor conductor relative to the thickness of the printed rank determining conductors; controlling the relative spacial position of these respective conductors on the face of the key within the openings; and layering the printed rank determining and sensor conductors at the keys such that the sensor is on the bottom, such as to insure the completion of the electrical contact between the rank determining conductors be accomplished before completing the sensor circuit that triggers the computer to initiate the measurements.

It is an object of the present invention to provide a multikey computer matrix keyboard that allows the computer to distinguish which key is being pressed by virtue of measuring the electrical properties of a plurality of electrical circuits completed by pressing the key. It is another object to provide a sensor circuit operatively connected to each key such that the computer can monitor the sensor circuit to determine when a key is pressed and when a key is not pressed, such as to make the necessary measurements determining which key was pressed. Fulfillment of these objects and the presence and fulfillment of additional objects will be apparent upon complete reading of the specification and claims taken in conjunction with the attached drawing.

DESCRIPTION OF THE PREFERRED EMBODIMENTS

The improvement to the matrix keyboard, according to the present invention, how it is incorporated into a previously known keyboard and how it functions and the associated advantages can perhaps be best explained and understood by reference to the drawings.

Figure 1:
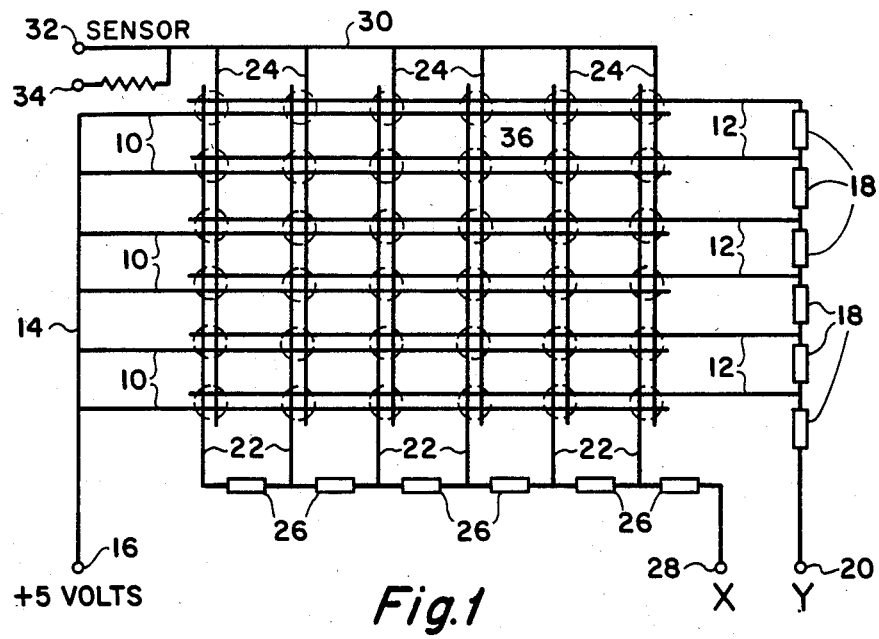
FIG. 1 is a schematic illustration of a cascaded, electrical element, matrix keyboard according to the present invention.

FIG. 1 illustrates a simplified schematic diagram of a membrane type keyboard involving two superimposed printed circuit sheets having half of the keyboard printed circuits on each sheet. On one printed sheet are two sets of parallel horizontal conductors 10 and 12. The lower conductors 10 are connected to a common input lead 14 and keyboard input terminal 16 which is represented in this illustrated embodiment as a plus 5 volt source. The upper horizontal conductors 12 connect to the right between individual electrical elements 18 of a serial cascade of elements which serve to make up the Y rank of row determining output circuit. This Y rank determining circuit leads to the keyboard output terminal 20. As illustrated, each successive conductor 12 from the bottom row to the top of the matrix keyboard introduces an additional electrical element 18 into the Y rank determining output circuit, thus uniquely defining in which row the pressed key is located.

Similarly, the other printed sheet of the keyboard contains the vertical pairs of parallel conductors 22 and 24. The vertical conductors 22 are individually connected between the second serial cascade of electrical elements 26, such that each successive vertical conductor 22 progressing from the X rank or column determining output terminal 28 bring into the circuit one additional cascaded electrical element 26. In this manner, each column of keys has a unique sum of electrical elements between the column conductor 22 associated with the column of keys and the X rank output terminal 28 which in operation serve to identify the specific column rank of the key being pressed. Prior to this invention, it was necessary for the computer to continuously monitor both the X and Y output terminals 20 and 28 and compare the respective measured values to a set of acceptable values in order to determine when a key was pressed and if so, which key.

The vertical conductors 24 connect to a sensor circuit lead 30 which in turn connects to the keyboard sensor output terminal 32 and is the basic subject matter of the present invention. Optionally (and as illustrated), the sensor output circuit lead 30 can also be resistively connected to the keyboard ground terminal 34 making the overall keyboard compatible with the analog game I/O socket of contemporary home computers (e.g., the Apple II). When a key 36 on the matrix keyboard (designated by dashed circles in FIG. 1) is pressed, the electrical circuit between all intersecting conductors 10, 12, 22 and 24 will simultaneously be completed. The computer will detect a positive 5 volt trigger signal at the sensor terminal 32 and respond by making the respective electrical measurements at the Y and X rank determining terminals 20 and 28. From these measurements, the computer can then calculate the respective row and column coordinates of the key and thus identify which key was pressed. Having established which key 36 was pressed, the computer can then proceed to execute the respective function, operation or data input associated with the respective key as determined by the preprogrammed software present in the computer memory.

In this manner the sensor circuit of the present invention is the only analog input to the computer that must be monitored to determine if a key is being pressed. Thus, the previous concept of continuously scanning the individual row and column keyboard outputs in order to measure the respective values and determine if they correspond to an acceptable set of values associated with a pressed key is eliminated. In principle, the sensor circuit is either on or off. When on, the computer will be triggered to make the necessary measurements to establish which key is pressed. When the signal turns off, the computer recognizes that the key was released, the measurements stop and the computer returns to monitoring only the sensor circuit. In addition to the inherent efficiency of monitoring only one analog input, the presence of the sensor circuit also allows for greater variety and flexibility of types of electrical measurements which can be used in the keyboard. Specifically, the fact that pressing and releasing of the key creates a specific time window during which the measurements are to be made various time related electrical properties can be advantageously employed. Thus, in addition to the traditional resistance and voltage measurements such properties as time delay, voltage rise or decay, time constants, current, capacitance, frequency and the like or combinations thereof can be used. Also, the sensor circuit and the associated time window allow for repeated measurements and diagnostic evaluations which enhance the confidence level for identifying the pressed key and reduces the incidents of extraneous signals and false striking of the key.

Figure 2:
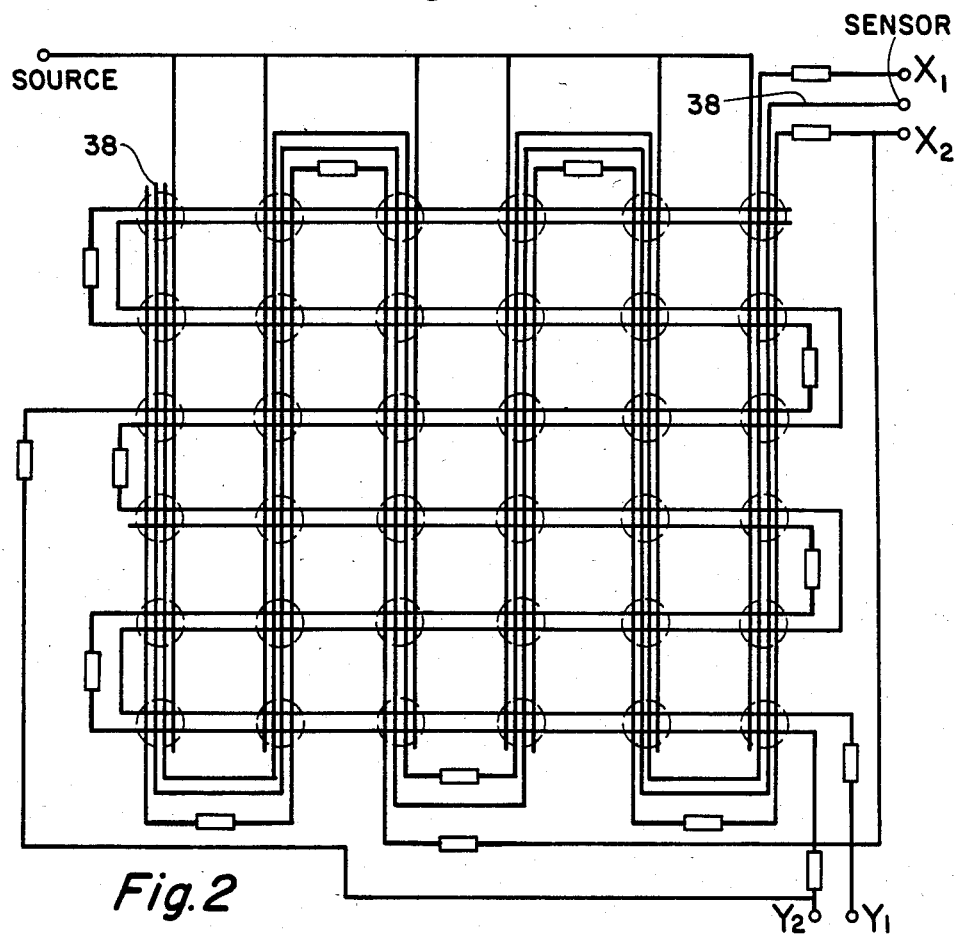
FIG. 2 is a schematic illustration of an alternate embodiment of a cascaded, electrical element, matrix keyboard according to the present invention.

FIG. 2 illustrates an alternate embodiment of the present invention wherein each row and each column determining circuit involves a pair of keyboard output circuits rather than a single output circuit and wherein the set of four cumulative electrical measurement values $X_1$, $X_2$, $Y_1$ and $Y_2$ uniquely define the coordinates of the key being pressed. According to this embodiment, pressing of the key brings into circuit simultaneously a portion of four separate cascaded series of electrical elements and a sensor circuit 38. This embodiment is particularly useful in order to create a relatively large number of keys in the matrix keyboard yet use only a few cascaded electrical elements. For example and as illustrated, a thirty-six key (6 by 6 matrix) keyboard can be created using no more than three consecutive electrical elements in series at one time. As seen in FIG. 2, this allows the electrical elements to vary significantly in value from each other, thus making the key identification relatively certain. The matrix keyboard illustrated in FIG. 2 can be readily expanded to a 9 by 9 matrix without using more than three electrical element values as disclosed in a commonly assigned and concurrently filed U.S. patent application for further explanation and more detailed description of the function of such an embodiment said U.S. patent application is herein incorporated by reference.

Figure 3:
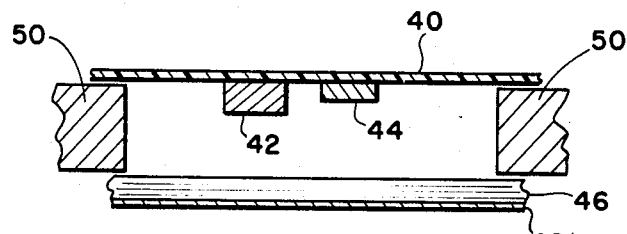
FIG. 3 is a cross sectional view of a typical printed key switch containing a sensor circuit according to the present invention.

FIG. 3 illustrates an enlarged view of the cross section of a flexible key according to the membrane type keyboard embodiment of FIG. 1. As illustrated, the top flexible printed sheet 40 contains on the underside two parallel conductors of varying thickness. The thickest conductor 42 is the rank determining conductor (the X conductor in this illustration) while the adjacent thinner conductor 44 is the sensor conductor. Directly below the printed conductors 42 and 44 of the upper sheet are the perpendicularly printed Y rank and/or source conductor 46 (actually both) deposited on the top of the bottom sheet 48. Since the upper printed sheet is flexible (e.g. conductive ink printed on mylar film) when pressed the conductors 42 and 44 are deflected downward such that X conductor 42 makes contact with the Y rank conductor and source conductors (both illustrated as 46) before the sensor conductor touches the source conductor. In this manner the circuits to be measured are electrically completed before the signal triggering the computer to make the measurement is received by the computer.

Figure 4:
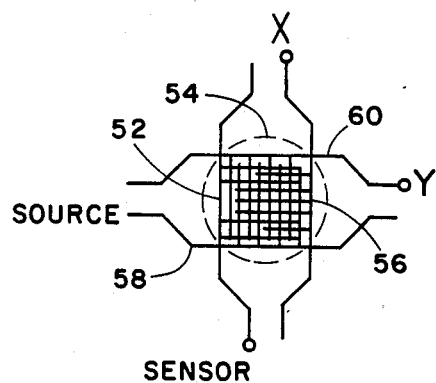
FIG. 4 is a top view of one embodiment of a printed key switch containing a sensor circuit according to the present invention.

FIG. 4 illustrates the top view of a membrane keyboard key wherein the sensor circuit conductor 52 at the key opening 54 (illustrated as a dashed circle) is intentionally displaced to the outer perimeter of the opening relative to the physical location of the X rank conductor 56. Consequently, when the upper flexible printed sheet containing the sensor circuit conductor 52 and X rank conductor 56 is pushed towards the lower printed conductors (source conductor 58 and Y rank conductor 60) the center of the key opening preferentially containing the X rank conductor 56 will make contact before the sensor conductor 52 makes contact. Thus, again insuring that the X and Y rank determining conductors and the source conductor are in contact when the computer responds to sensor conductor 52 touching the source conductor 58. Thus, the necessary circuits to be measured are completed before the measurements are made.

Figure 5:
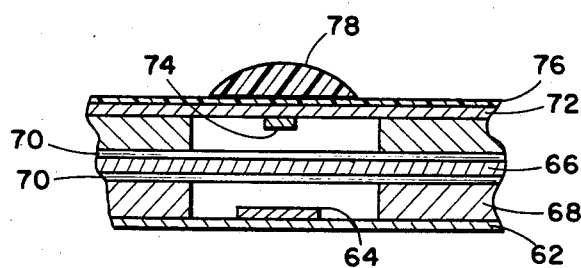
FIG. 5 is an enlarged cross-sectional view of a portion of the keyboard involving the printed circuit key with informational overlay and raised key tabs.

FIG. 5 illustrates a third alternative method of insuring the completion of rank to source circuits before measuring the respective completed circuits wherein multiple flexible printed circuit layers are employed. As illustrated, the bottom printed sheet 62 with sensor conductor 64 is separated from a middle flexible printed sheet 66 by an insulating layer 68. On both side of the intermediate flexible sheet 66 are printed source conductors 70. The upper side of sheet 66 also contains a parallel rank determining conductor (either X or Y). A second insulated layer 72 is sandwiched on top of flexible sheet 66 below the upper flexible sheet 74 having the other rank conductor 76 printed on the underside. Because of the layered structure when the key is pressed, conductor 74 will first approach and touch the other rank determining conductor and source conductor on the upper side of sheet 66. Upon further key depression the under side of sheet 66 will contact bottom sheet 62 thus triggering the sensor signal circuit which instructs the computer to make the measurements. FIG. 5 further illustrates the use of an informational overlay 76 and a raised or deformed key tab at the key opening which assists the operator to press the key at the proper position, thus improving electrical contact.

Having thus described the invention with a certain degree of particularity, it is manifest that many changes can be made in the details of construction and arrangement of components without departing from the spirit and scope of this disclosure. Therefore, it is to be understood that the invention is not limited to the embodiments set forth herein for purposes of exemplification, but is to be limited only by the scope of the attached claims, including a full range of equivalents to which each element thereof is entitled.

We claim:

1. In a multikey keyboard for inputting data to a computer wherein the X and Y rank of the pressed key is determined by the closing of a corresponding key switch that brings into the X and Y keyboard output circuits selected portions of at least a pair of separate series of electrical elements whose respective cumulative values are subsequently measured by the computer to uniquely establish the coordinates of the pressed key, the specific improvement comprising: providing said keyboard with a sensor circuit means comprising a keyboard output sensor terminal electrically connected to a first additional conductor circuit wherein said conductor circuit is operatively connected to each of said key switches; and further providing said keyboard with a signal source circuit means comprising a keyboard input signal terminal electrically connected to a second additional conductor circuit wherein said second additional conductor circuit is operatively connected to each of said key switches, such that when a key is pressed, said signal source circuit means is brought into circuit with said sensor circuit means thus triggering the computer to measure said cumulative values that establish the coordinates of the pressed key.

2. An improved multikey keyboard of claim 1 wherein said electrical elements and respective cumulative values involve the measurement of an electrical property selected from the group consisting of resistance, voltage, current, capacitance, frequency, time delay or a combination thereof.

3. An improved multikey keyboard of claim 1 wherein said keyboard further comprises two opposed printed circuit sheets containing conductive printing and separated by an insulated sheet perforated at the position of the keys and wherein the top sheet is sufficiently flexible to serve as the key switch by flexing and contacting the conductive printing of the upper and lower printed sheets.

4. An improved multikey keyboard of claim 3 wherein said printing of said conductor circuit of said sensor circuit means is spacially arranged at said perforated key position such that the central region of said key is predominantly printed conductors associated with rank determining circuits surrounded by said sensor conductor circuits thus insuring the completion of the electrical contact between the rank determining conductors on said printed sheets when said upper sheet is flexed to make contact with the lower printed sheet before the computer receives the trigger signal which initiates said measurements.

5. An improved keyboard of claim 3 further comprising a third opposed printed circuit sheet separated by a second insulating sheet perforated at the position of the keys wherein both the top and middle printed circuit sheets are flexible to serve as the key and the middle sheet has printed conductors on both sides with said sensor conductor circuit making contact with said source conductor circuit by deflecting said middle printed circuit sheet into contact with said bottom printed circuit sheet.

6. An improved multikey keyboard of claim 3 further comprising a deformed key tab means at the key opening thus assisting the operator to press said key at the proper position.

7. An improved multikey keyboard of claim 6 wherein said key tab means is a raised key tab.

8. An improved multikey keyboard of claim 6 further comprising an information overlay.

9. An improved multikey keyboard of claim 8 wherein said information overlay further comprises a raised key tab means at the key openings.

10. An improved multikey keyboard of claim 8 wherein said information overlay is in Braille.

11. In a multikey keyboard for inputting data to a computer wherein the X and Y rank of the pressed key is determined by the closing of a corresponding key switch that brings into the X and Y keyboard output circuits selected portions of at least a pair of separate series of electrical elements whose respective cumulative values are subsequently measured by the computer to uniquely establish the coordinates of the pressed key, the specific improvement comprising: providing said keyboard with a sensor circuit means comprising a keyboard output sensor terminal electrically connected to a first additional conductor circuit wherein said conductor circuit is operatively connected to each of said key switches; and further providing said keyboard with a signal source circuit means comprising a keyboard input signal terminal electrically connected to a second additional conductor circuit wherein said second additional conductor circuit is operatively connected to each of said key switches, such that when a key is pressed, said signal source circuit means is brought into circuit with said sensor circuit means thus triggering the computer to measure said cumulative values that establish the coordinates of the pressed key and wherein said keyboard further comprises two opposed printed circuit sheets containing conductive printing and separated by an insulated sheet perforated at the position of the keys and wherein the top sheet is sufficiently flexible to serve as the key switch by flexing and contacting the conductive printing of the upper and lower printed sheets and wherein said printing of said first additional conductor circuit of said sensor circuit means is dimensionally thinner than the printing of the adjacent rank determining conductors thus insuring the completion of the electrical contact between the rank determining conductors on said printed sheets when said upper sheet is flexed to make contact with the lower printed sheet before the computer receives the trigger signal which initiates said measurement.

* * * * *